(12) United States Patent
Inada et al.

(10) Patent No.: US 9,850,920 B2
(45) Date of Patent: Dec. 26, 2017

(54) FLUID CONTROL APPARATUS

(71) Applicant: FUJIKIN INCORPORATED, Osaka-shi (JP)

(72) Inventors: Toshiyuki Inada, Osaka (JP); Takahiro Matsuda, Osaka (JP); Mutsunori Koyomogi, Osaka (JP)

(73) Assignee: FUJIKIN INCORPORATED, Osaka-Shi (JP)

( * ) Notice: Subject to any disclaimer, the term of this patent is extended or adjusted under 35 U.S.C. 154(b) by 16 days.

(21) Appl. No.: 14/395,850

(22) PCT Filed: Apr. 17, 2013

(86) PCT No.: PCT/JP2013/061369
§ 371 (c)(1),
(2) Date: Oct. 21, 2014

(87) PCT Pub. No.: WO2013/161640
PCT Pub. Date: Oct. 31, 2013

(65) Prior Publication Data
US 2015/0075660 A1 Mar. 19, 2015

(30) Foreign Application Priority Data
Apr. 27, 2012 (JP) ................... 2012-102968

(51) Int. Cl.
*F15B 13/08* (2006.01)
*F16K 27/00* (2006.01)
*H01L 21/67* (2006.01)

(52) U.S. Cl.
CPC ...... *F15B 13/0817* (2013.01); *F15B 13/0814* (2013.01); *F15B 13/0871* (2013.01);
(Continued)

(58) Field of Classification Search
CPC ......... Y10T 137/87885; F15B 13/0814; F15B 13/0817; F15B 13/0871; F15B 13/0896; F16K 27/003; H01L 21/67017
See application file for complete search history.

(56) References Cited

U.S. PATENT DOCUMENTS 6,152,175 A * 11/2000 Itoh ................. F16K 27/003
137/602
6,435,215 B1 * 8/2002 Redemann ............ C23C 16/44
137/269
(Continued)

FOREIGN PATENT DOCUMENTS

JP 05-172265 A 7/1993
JP 10-300000 A 11/1998
(Continued)

OTHER PUBLICATIONS

International Search Report dated Jul. 23, 2013, issued for PCT/JP2013/061369.
(Continued)

*Primary Examiner* — Seth W Mackay-Smith
(74) *Attorney, Agent, or Firm* — Locke Lord LLP; Howard M. Gitten

(57) ABSTRACT

A fluid control apparatus has a reduced number of components and enables simple alteration such as increasing or decreasing the number of lines. Chanel blocks on a lower stage include a plural-line (three-line) passage block disposed over a plurality of lines. The plural-line passage block receives an upper stage over three lines, with each of the lines including an inlet extension of a flow rate controller, and two inlet-side on-off valves arranged in series with the inlet extension. The plural-line passage block has longitudinal passages and transverse passages therein. The longitudinal passages are in communication with passages of the fluid control devices arranged in series per line. The trans-
(Continued)

verse passages are in communication with passages of fluid control devices arranged in adjacent lines.

7 Claims, 11 Drawing Sheets

(52) U.S. Cl.
CPC ........ *F15B 13/0896* (2013.01); *F16K 27/003* (2013.01); *H01L 21/67017* (2013.01); *Y10T 137/87885* (2015.04)

(56) References Cited

U.S. PATENT DOCUMENTS

| | | | | |
|---|---|---|---|---|
| 6,615,871 | B2* | 9/2003 | Ohmi | F15B 13/0817 137/597 |
| 6,868,867 | B2* | 3/2005 | Yamaji | F16K 27/003 137/884 |
| 7,152,629 | B2* | 12/2006 | Tokuda | F16K 27/003 137/884 |
| 7,806,143 | B2* | 10/2010 | Taskar | F16K 27/003 137/884 |
| 2001/0020488 | A1* | 9/2001 | Ishii | F16K 27/003 137/271 |
| 2002/0185185 | A1 | 12/2002 | Yamaji et al. | |
| 2005/0284529 | A1 | 12/2005 | Iwabuchi | |
| 2009/0183792 | A1* | 7/2009 | Tokuda | F15B 13/0817 137/798 |

FOREIGN PATENT DOCUMENTS

| | | |
|---|---|---|
| JP | 2002-349797 A | 12/2002 |
| JP | 2005-069305 A | 3/2005 |
| JP | 2005-69305 A | 3/2005 |
| JP | 2006-009969 A | 1/2006 |
| JP | 2006-9969 A | 1/2006 |
| WO | WO-2011/040268 A1 | 4/2011 |

OTHER PUBLICATIONS

Japanese Patent Office, Notice of Reasons for Rejection issued in counter-part Japanese Patent Application No. 102968/12, dated Feb. 16, 2016; 9 pages.

* cited by examiner (a)

(b)

(a)

(b)

(a)

(b)

(a)

(b)

FLUID CONTROL APPARATUS

TECHNICAL FIELD

The present invention relates to a fluid control apparatus, and more particularly to, a fluid control apparatus including a plurality of fluid control devices and a plurality of passage blocks.

BACKGROUND ART

Fluid control apparatuses for use in semiconductor fabrication equipment have been increasingly integrated by installing lines each having a plurality of fluid control devices in series that are attached to a support on a base in parallel without interposing pipes and joints thereamong. Patent Literature 1 discloses such a fluid control apparatus having an upper stage and a lower stage. The upper stage has a plurality of lines arranged in parallel. Each of the line has a plurality of fluid control device arranged in series. The lower stage has a plurality of passage blocks that connect the fluid control devices on the upper stage.

FIG. 12 shows a conventional fluid control apparatus, which is a target for improvement to be made by the present invention. FIG. 12 shows one line having an upper stage and a lower stage. The conventional fluid control apparatus has a plurality of such lines arranged in parallel.

The conventional fluid control apparatus has a plurality of fluid control devices arranged on the upper stage. The fluid control devices include, from the left (from the inlet side), a third inlet-side on-off valve 91, a pressure regulator 92, a filter 93, a first inlet-side on-off valve 94, a second inlet-side on-off valve 95, a mass flow controller 96, and a first outlet-side on-off valve 97. The third inlet-side on-off valve 91 is connected to a process gas supply pipe 103.

The mass flow controller 96 includes a body 96a, an inlet extension 96b, and an outlet extension 96c. These extensions 96b, 96c are disposed on the opposite side surfaces of the mass flow controller body 96a.

Each of the fluid control devices 91, 92, 93, 94, 95, 96, 97 has a passage with a downward opening. These passages are connected to a plurality of block joints (or passage blocks) with various shapes that are arranged on the lower stage, respectively. These block joints (passage blocks) in the conventional fluid control apparatus includes six block joints 99, a block joint 100, and a block joint 101. Each of the block joints 99 has a V-shaped passage. The block joints 99 connect respective adjacent fluid control devices 91, 92, 93, 94, 95, 96b, 96c, 97. The block joint 100 is disposed between two block joints 99 each having a V-shaped passage 99a and supports the second inlet-side on-off valve 95. The block joint 101 has a pipe joint 101a and supports an outlet end of the first outlet-side on-off valve 97.

The block joint 100 disposed between the two block joints 99 that supports the second inlet-side on-off valve 95 and the block joint 101 that supports the outlet end of the first outlet-side on-off valve 97 are both disposed over all the plurality of lines (the block joints 100, 101 are also referred to as "manifold block joints"). As for the block joints 99, different lines have different components. The manifold block joint 100 is usually used as a purge gas line. The manifold block joint 101 is usually used as a process gas line and a purge gas line.

Patent Literature 1: Japanese Unexamined Patent Application Publication No. 2002-349797

SUMMARY OF THE INVENTION

Technical Problem

Unfortunately, the conventional fluid control apparatus described above requires a large number of the block joints 99 each having a V-shaped passage 99a since each of the block joints 99 connects the adjacent fluid control devices 91, 92, 93, 94, 95, 96b, 96c, 97. In addition, the conventional fluid control apparatus has another disadvantage that the manifold block joints 100, 101 have to be changed every time the number of lines is changed since the manifold block joints 100, 101 are disposed over all the plurality of lines and therefore the dimensions of the manifold block joints 100, 101 are predetermined depending on the number of lines. Moreover, because connecting each of the block joints 99 on the lower stage to the respective fluid control devices 91, 92, 93, 94, 95, 96b, 96c, 97 on the upper stage requires a seal therebetween, the conventional fluid control apparatus requires a large number of seals. As a result, the conventional fluid control apparatus has disadvantages that it requires a large number of components and that alterations such as increasing or decreasing the number of lines are troublesome.

An object of the present invention is to provide a fluid control apparatus that has a reduced number of components and enables simple alteration such as increasing or decreasing the number of lines.

Solution to Problem

A fluid control apparatus in accordance with the present invention includes an upper stage and lower stage. The upper stage has at least three lines arranged in parallel. Each of the lines has a plurality of fluid control devices arranged in series. The lower stage has a plurality of passage blocks that connect the fluid control devices on the upper stage. The passage blocks on the lower stage include at least one plural-line passage block disposed over a plurality of lines. The plural-line passage block receives the upper stage over at least two lines among the entire lines and supports at least two fluid control devices per line. The plural-line passage block includes therein longitudinal passages and transverse passages. The longitudinal passages are in communication with passages of the fluid control devices arranged in series per line. The transverse passages are in communication with passages of the fluid control devices arranged in adjacent lines.

The upper stage in each line includes, for example, a flow rate controller that constitutes a key component, two on-off valves arranged on the inlet side of the flow rate controller, and one on-off valve arranged on the outlet side of the flow rate controller. The upper stage in the line may further include a filter, a pressure regulator, and other devices, as required. The flow rate controllers that may be used herein include thermal mass flow rate controllers such as mass flow controllers, and pressure-type flow rate controllers referred to as fluid control systems (FCSs).

The plural-line passage blocks may be used for, for example, two lines, three lines, four lines, and five lines. Among these variations, one type of the plural-line passage block may be used while two types or more may also be used in combination.

The number of passage blocks required for the lower stage (the number of components) can be reduced by using the plural-line passage block.

The expression "the upper stage over at least two lines among the entire lines" means in the case where the upper stage includes six lines, for example, using three two-line passage blocks, using two three-line passage blocks, or using one two-line passage block and one four-line passage block, instead of using one six-line passage block.

A conventional passage block used over a plurality of lines (i.e. a manifold block joint) is disposed over the entire lines of the fluid control apparatus, and therefore has a predetermined dimension depending on the number of lines to be used. Hence, when the number of lines increases or decreases (when the number of lines increases from six lines to eight lines, for example), replacement of the manifold block joint in use by one with a dimension suitable for the number of lines to be used is required. In the example discussed above, the fluid control apparatus in accordance with the present invention enables continuously using the existing plural-line passage blocks for the existing six lines (i.e., using three two-line passage blocks, using two three-line passage blocks, or using one two-line passage blocks and one four-line passage blocks) while additionally using one two-line passage block for newly added two lines. This simplifies the troublesome alteration.

In addition, using the plural-line passage block allows reduction of the number of seals required, since connection between the adjacent lines may be accomplished inside the plural-line passage block.

In accordance with a preferred embodiment of the present invention, the fluid control apparatus further comprises a single-line passage block disposed in one of the lines, as one of the passage blocks on the lower stage. The single-line passage block receives the upper stage in one of the lines and supports at least two fluid control devices corresponding to those supported by the plural-line passage block. It is preferable that at least one plural-line passage block and at least one single-line passage block are used together.

The joint use of the plural-line passage block and the single-line passage block allows various combinations thereof, thereby readily meeting the requested specifications about the number of the lines and the configuration. To cope with the case where the number of the lines is increased by one, a combined use of the plural-line passage blocks is possible, but such a combined use may sometimes require detaching part of the existing plural-line passage blocks in use. In such a case, using a single-line passage block additionally enables the existing plural-line passage block(s) to be used continuously.

In accordance with a preferred embodiment of the present invention, the passages each having an opening on an upper surface of the passage block in adjacent lines are connected to each other by an inverted U-shaped pipe.

Using the inverted U-shaped pipe facilitates the arrangement of the plural-line passage block and the single-line passage block that are used together. Using such an inverted U-shaped pipe also enables the number of the lines to be increased or decreased readily.

In accordance with a preferred embodiment of the present invention, the fluid control apparatus comprises per line a flow rate controller that regulates a flow rate, as one of the fluid control devices on the upper stage. The flow rate controller has a body, an inlet extension, and an outlet extension. Two kinds of the plural-line passage blocks used are a first plural-line passage block and a second plural-line passage block. The first plural-line passage block supports at least two of the fluid control devices that are the inlet extension of the flow rate controller and two inlet-side on-off valves arranged in series therewith. The second plural-line passage block supports at least two fluid control devices that are the outlet extension the flow rate controller and one outlet-side on-off valve arranged in series therewith.

The flow rate controller and these on-off valves arranged on the inlet and outlet sides of the flow controller constitute the essential configuration of the fluid control apparatus. Using the plural-line passage block leads to a reduction in number of the components used in this part of the fluid control apparatus, resulting in a substantial reduction in number of the components used in the entire fluid control apparatus.

The passage blocks used on the lower stage include conventional passage blocks each having a V-shaped passage, which are used for connecting the fluid control devices arranged in series. Such passage blocks with V-shaped passages may be used.

In the following description, the terms "upper" and "lower" refer to the upper and lower sides of FIG. 1, respectively, for descriptive purposes. In using the fluid control apparatus in accordance with the present invention, it may be disposed horizontally or vertically.

ADVANTAGEOUS EFFECTS OF INVENTION

The fluid control apparatus of the present invention includes a plural-line passage block that receives the upper stage over at least two lines among the entire lines and supports at least two fluid control devices in each of the lines. Using such a plural-line passage block enables a successful reduction in number of the components used. In addition, the plural-line passage block is provided therein with transverse passages whereby passages in the fluid control devices in adjacent lines are in communication with each other. These transverse passages enable the plural-line passage block to connect the adjacent lines inside the plural-line passage block, resulting in a successful reduction in number of the seals used. Moreover, using the fluid control apparatus according to the present invention simplifies the troublesome alteration in increasing or decreasing the lines as compared to the case where conventional passage blocks disposed over the entire lines are used.

BRIEF DESCRIPTION OF DRAWINGS

FIG. 3 shows an embodiment of a first plural-line passage block used in the fluid control apparatus in accordance with the present invention, together with inlet-side on-off valves, in which FIG. 3(a) is a side view and FIG. 3(b) is a plan view.

FIG. 4 shows the first plural-line passage block of FIG. 3, with the inlet-side on-off valves detached, in which FIG. 4(a) is a side view and FIG. 4(b) is a plan view.

FIG. 5 shows an embodiment of a second plural-line passage block used in the fluid control apparatus in accordance with the present invention, together with outlet-side on-off valves, in which FIG. 5(a) is a side view and FIG. 5(b) is a plan view.

REFERENCE SIGNS LIST

1: fluid control apparatus
16: mass flow controller (flow rate controller)
18: FCS (flow rate controller)
21: first plural-line passage block
22: second plural-line passage block
25: first single-line passage block
26: second single-line passage block

DESCRIPTION OF EMBODIMENTS

Embodiments of the present invention will now be described with reference to the drawings.

Figure 1:
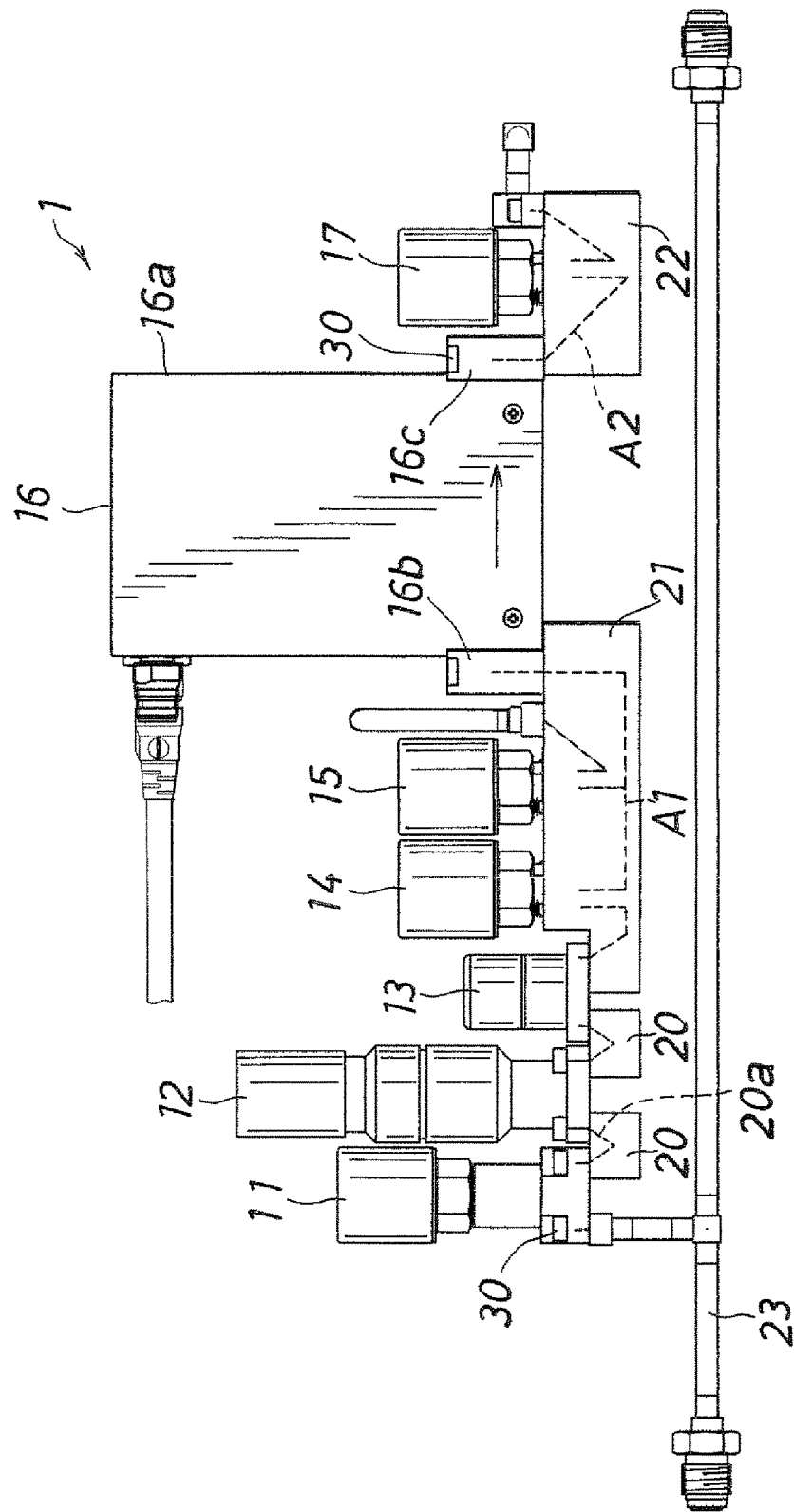
FIG. 1 a side view of a fluid control apparatus in accordance with an embodiment of the present invention.

FIG. 1 shows a first embodiment of the fluid control apparatus in accordance with the present invention. The fluid control apparatus is used, for example, in semiconductor fabrication equipment. Such a fluid control apparatus having an upper stage and a lower stage includes a plurality of lines arranged in parallel. The upper stage includes a plurality of fluid control devices arranged in series in each of the lines. The lower stage includes a plurality of passage blocks that connect the plurality of fluid control devices on the upper stage. FIG. 1 shows one line of the fluid control apparatus.

A line 1 of the fluid control apparatus has a plurality of fluid control devices arranged on the upper stage. These fluid control devices include, in sequence from the left (the inlet side), a third inlet-side on-off valve 11, a pressure regulator 12, a filter 13, a first inlet-side on-off valve 14, a second inlet-side on-off valve 15, a mass flow controller 16, and an outlet-side on-off valve 17. The third inlet-side on-off valve 11 is connected to a process gas supply pipe 23.

The mass flow controller 16 includes a body 16*a*, an inlet extension 16*b*, and an outlet extension 16*c*. The inlet and outlet extensions 16*b*, 16*c* are disposed on opposed side surfaces of the mass flow controller body 16*a*. The inlet extension 16*b* has an inlet of the mass flow controller 16, whereas the outlet extension 16*c* has an outlet of the mass flow controller 16.

Each of the fluid control devices 11, 12, 13, 14, 15, 16, 17 has a passage with a downward opening. These passages are connected to respective passage blocks with various shapes that are disposed on the lower stage. The fluid control apparatus discussed above has a plurality of passage blocks that are arranged on the lower stage and supports the fluid control devices 11, 12, 13, 14, 15, 16*b*, 16*c*, 17 on the upper stage. These passage blocks include two block joints (passage blocks) 20, a first plural-line passage block 21, and a second plural-line passage block 22. The two block joints (passage blocks) 20 having V-shaped passages 20*a* connect the adjacent fluid control devices (the third inlet-side on-off valve 11, the pressure regulator 12, and the filter 13). The first plural-line passage block 21 is a lower stage member that receives an outlet end of the filter 13, the first inlet-side on-off valve 14, the second inlet-side on-off valve 15, and the inlet extension 16*b* of the mass flow controller 16. The second plural-line passage block 22 is a lower stage member that receives the outlet extension 16*c* of the mass flow controller 16, and the outlet-side on-off valve 17.

The third inlet-side on-off valve 11, the pressure regulator 12, and the filter 13 are attached to the respective block joints 20 having the V-shaped passages 20*a* from above with bolts 30. The inlet extension 16*b* of the mass flow controller 16 is attached to the first plural-line passage block 21 from above with a bolt 30. The outlet extension 16*c* of the mass flow controller 16 is attached to the second plural-line passage block 22 from above with a bolt 30. The first inlet-side on-off valve 14 and the second inlet-side on-off valve 15 are screwed into the first plural-line passage block 21 without any bolt. The first and second inlet-side on-off valves 14, 15 and the first plural-line passage block 21 thus integrated constitute a valve referred to as a "block-type valve." The outlet-side on-off valve 17 is screwed into the second plural-line passage block 22 without any bolt. The outlet-side on-off valve 17 and the second plural-line passage block 22 thus integrated constitute a valve referred to as a "block-type block."

As describe below, the first plural-line passage block 21 and the second plural-line passage block 22 are the characteristic features of the fluid control apparatus described above.

Figure 2:
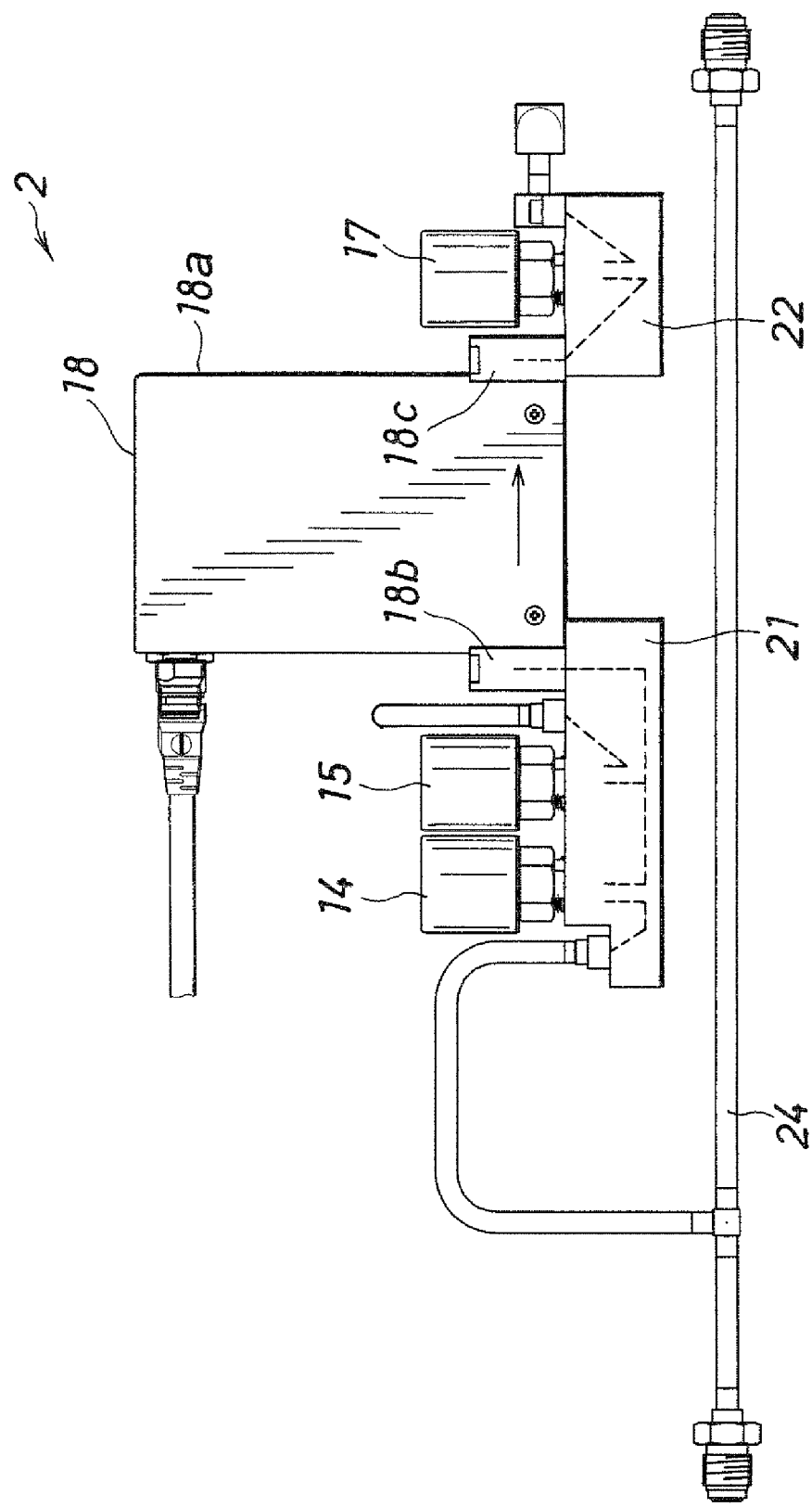
FIG. 2 is a side view of the fluid control apparatus in accordance with another embodiment of the present invention.

FIG. 2 shows a second embodiment of the fluid control apparatus in accordance with the present invention. In the fluid control apparatus in accordance with the second embodiment, the flow rate controller is a fluid control system (FCS), which is a pressure-type flow rate controller, as compared to the mass flow controller (thermal flow rate controller) in the first embodiment.

A line 2 of the fluid control apparatus in accordance with the second embodiment includes a plurality of fluid control devices arranged on the upper stage. Such fluid control devices includes, in sequence from the left (inlet side), the first inlet-side on-off valve 14, the second inlet-side on-off valve 15, an FCS 18, and the outlet-side on-off valve 17.

The FCS 18 includes a body 18*a*, an inlet extension 18*b*, and an outlet extension 18*c*. These extensions 18*b*, 18*c* are disposed on the opposite side surfaces of the FCS body 18*a*. The inlet extension 18*b* has an inlet of the FCS 18, whereas the outlet extension 18*c* has an outlet of the FCS 18.

In the second embodiment, the fluid control apparatus has a plurality of passage blocks disposed on the lower stage that support the fluid control devices 14, 15, 18*b*, 18*c*, 17 on the upper stage. These passage blocks include the first plural-line passage block 21 and the second plural-line passage block 22. The first plural-line passage block 21 is a lower stage member that receives the first inlet-side on-off valve 14, the second inlet-side on-off valve 15, and the inlet extension 18*b* of the FCS 18. The second plural-line passage block 22 is a lower stage member that receives the outlet extension 18c of the FCS 18 and the outlet-side on-off valve 17.

The first plural-line passage block 21 is connected to a process gas supply pipe 24.

The first plural-line passage block 21 and the second plural-line passage block 22 in the second embodiment have the same configurations as those in the first embodiment. These plural-line passage blocks 21, 22 are the characteristic features of the fluid control apparatus in the second embodiment.

Figure 3:
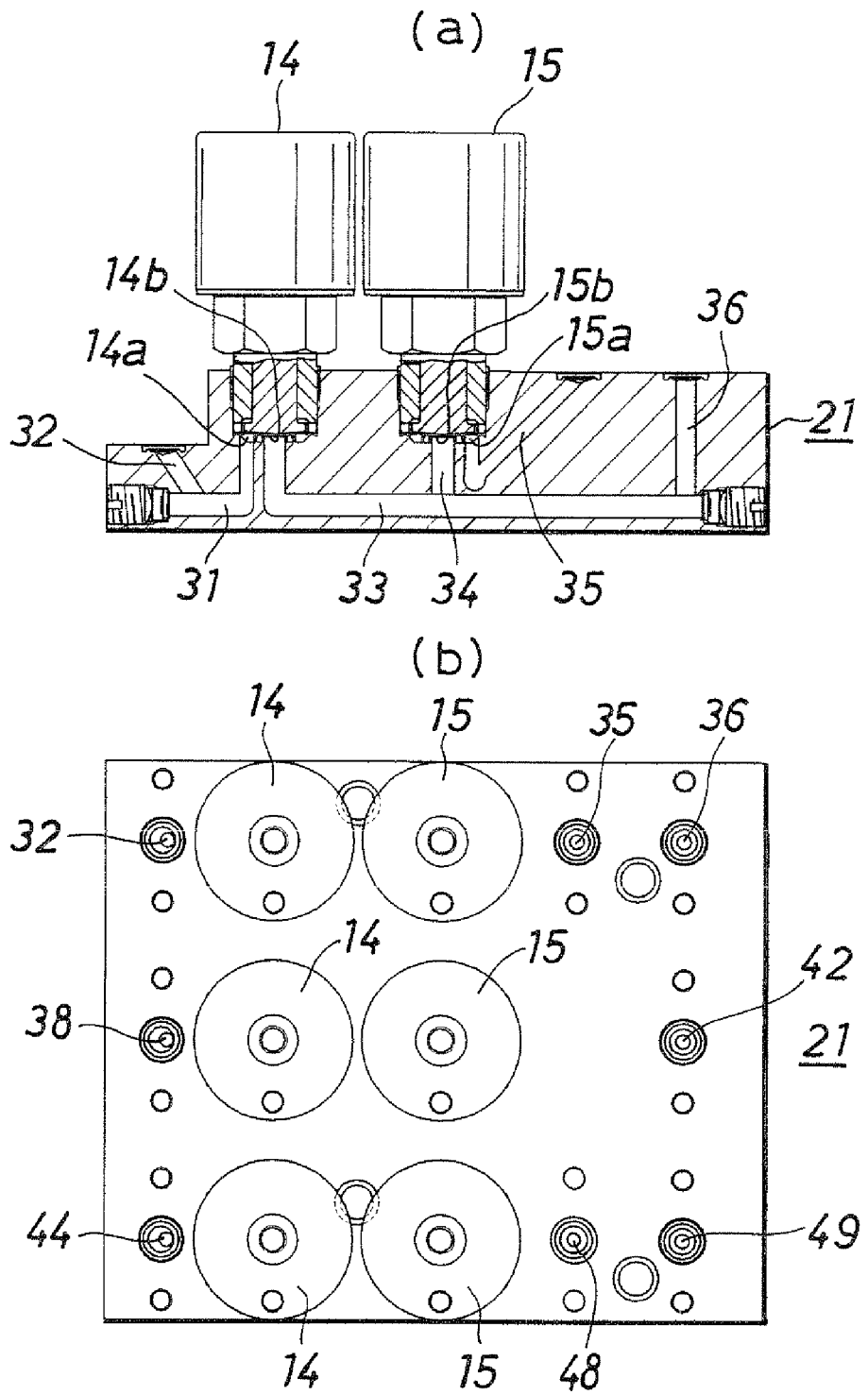
Figure 4:
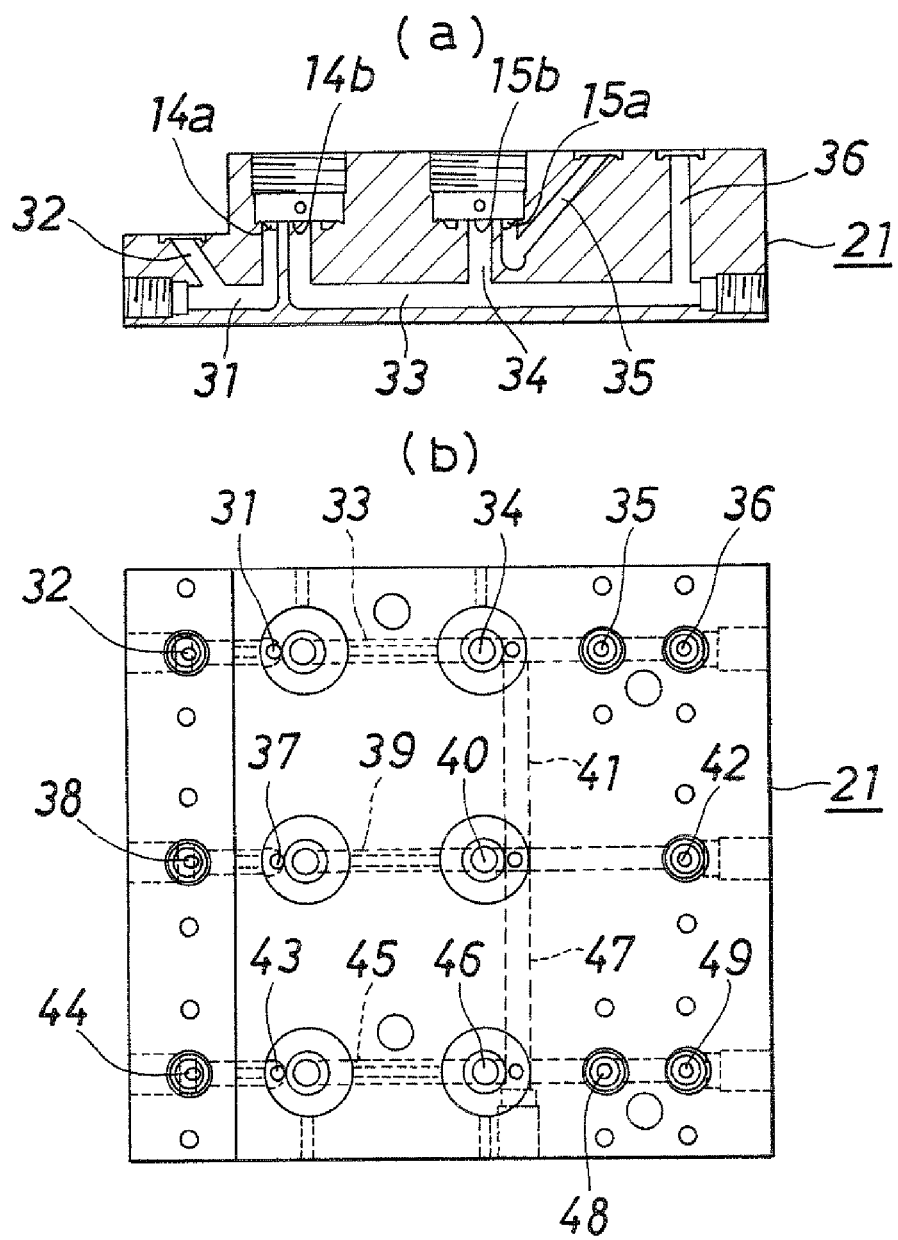

FIGS. 3 and 4 show the detailed configuration of the first plural-line passage block 21.

FIG. 3 shows a state in which the first inlet-side on-off valve 14 and the second inlet-side on-off valve 15 are attached. FIG. 4 shows a state in which the first and second inlet-side on-off valves 14, 15 are detached.

The first plural-line passage block 21 disposed over three lines. In each of the lines, the first plural-line passage block 21 supports the inlet extension 16b (18b) of the flow rate controller 16 (18) as an upper stage member, and two inlet-side on-off valves 14, 15 arranged in series with the inlet extension 16b (18b).

The first plural-line passage block 21 has a first passage 31, a second passage 32, a third passage 33, a fourth passage 34, a fifth passage 35, and a sixth passage 36, for a first line (a line 1 in FIG. 1 or a line 2 in FIG. 2). The first passage 31 is in communication with an inlet port 14a of the first on-off valve 14 in the first line. The second passage 32 is bifurcated from the first passage 31 and has an opening on an upper surface of the first plural-line passage block 21 near the inlet end. The third passage 33 is in communication with an outlet port 14b of the first on-off valve 14 in the first line. The fourth passage 34 extends upward from a middle portion of the third passage 33 and is in communication with an outlet port 15b of the second on-off valve 15 in the first line. The fifth passage 35 has an opening on the upper surface of the first plural-line passage block 21 and is in communication with an inlet port 15a of the second on-off valve 15 in the first line. The sixth passage 36 extends upward from a vicinity of an end of the third passage 33 and has an opening on the upper surface of the first plural-line passage block 21.

The first plural-line passage block 21 has a seventh passage 37, an eighth passage 38, a ninth passage 39, a tenth passage 40, a eleventh passage 41, and a twelfth passage 42, for a second line. The seventh passage 37 is in communication with an inlet port 14a of the first on-off valve 14 in the second line. The eighth passage 38 is bifurcated from the seventh passage 37 and has an opening on an upper surface of the first plural-line passage block 21 near the inlet end. The ninth passage 39 is in communication with an outlet port 14b of the first on-off valve 14 in the second line. The tenth passage 40 extends upward from a middle portion of the ninth passage 39 and is in communication with an outlet port 15b of the second on-off valve 15 in the second line. The eleventh passage 41 has one end in communication with the fifth passage 35 and the other end in communication with an inlet port 15a of the second on-off valve 15 in the second line. The twelfth passage 42 extends upward from a vicinity of an end of the ninth passage 39 and has an opening on the upper surface of the first plural-line passage block 21.

The first plural-line passage block 21 has a thirteenth passage 43, a fourteenth passage 44, a fifteenth passage 45, a sixteenth passage 46, a seventeenth passage 47, an eighteenth passage 48, and a nineteenth passage 49, for a third line. The thirteenth passage 43 is in communication with an inlet port 14a of the first on-off valve 14 in the third line. The fourteenth passage 44 is bifurcated from the thirteenth passage 43 and has an opening on an upper surface of the first plural-line passage block 21 near the inlet end. The fifteenth passage 45 is in communication with an outlet port 14b of the first on-off valve 14 in the third line. The sixteenth passage 46 extends upward from a middle portion of the fifteenth passage 45 and is in communication with an outlet port 15b of the second on-off valve 15 in the third line. The seventeenth passage 47 has one end in communication with the eleventh passage 41 and the other end in communication with an inlet port 15a of the second on-off valve 15 in the third line. The eighteenth passage 48 has an opening on the upper surface of the first plural-line passage block 21 and is in communication with an inlet port 15a of the second on-off valve 15 in the third line. The nineteenth passage 49 extends upward from a vicinity of an end of the fifteenth passage 45 and has an opening on the upper surface of the first plural-line passage block 21.

The fifth passage 35, the eleventh passage 41, the seventeenth passage 47, and the eighteenth passage 48 serve as a conventional manifold block joint 100 and constitute transverse passages that communicate the second on-off valves 15 as the fluid control devices arranged in the adjacent lines with each other, which are used as a purge gas line. Passages other than these transverse passages 35, 41, 47, 48, constitute longitudinal passages that communicate passages of the fluid control devices arranged in series with each other.

Figure 5:
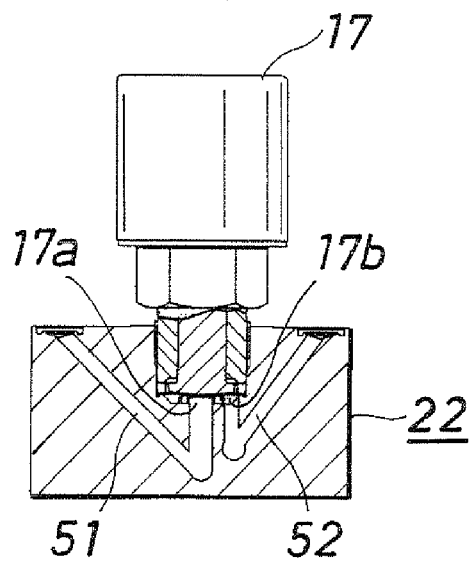
Figure 5:
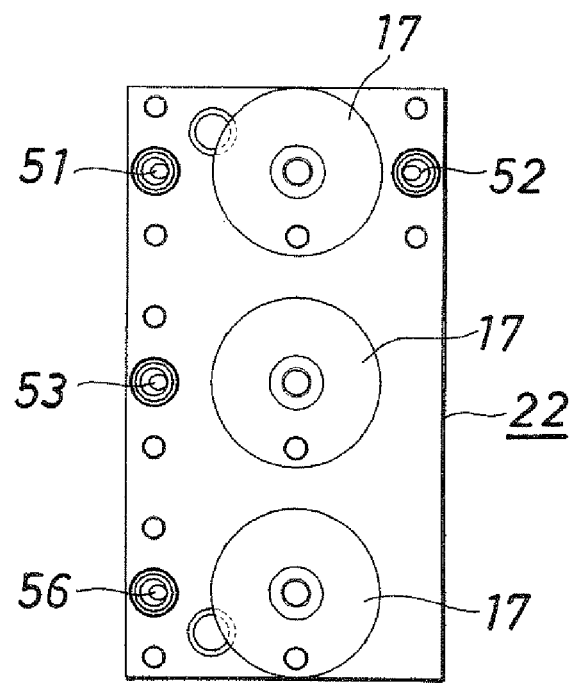
Figure 6:
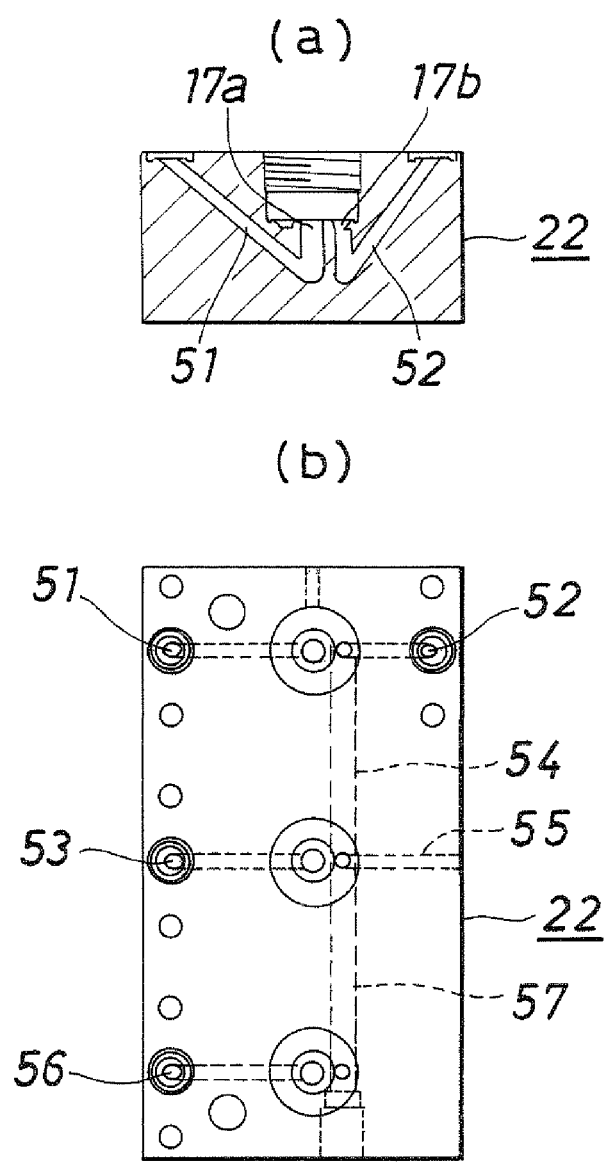
FIG. 6 shows the second plural-line passage block of FIG. 5, with the outlet-side on-off valves detached, in which FIG. 6(*a*) is a side view and FIG. 6(*b*) is a plan view.

The second plural-line passage block 22 shown in FIGS. 5 and 6 are disposed over three lines. Each of the lines includes the outlet extension 16c (18c) of the flow rate controller 16 (18) as an upper stage member, and the outlet-side on-off valve 17 arranged in series with the outlet extension 16c (18c). The second plural-line passage block 22 supports these components over three lines.

The second plural-line passage block 22 includes a first passage 51 and a second passage 52, for a first line. The first passage 51 has an opening on an upper surface of the second plural-line passage block 22 at a vicinity of an inlet end thereof and is in communication with an inlet port 17a of the outlet-side on-off valve 17 in the first line. The second passage 52 has an opening on an upper surface of the second plural-line passage block 22 at a vicinity of an inlet end thereof and is in communication with an outlet port 17b of the outlet-side on-off valve 17 in the first line.

The second plural-line passage block 22 includes a third passage 53 and a fourth passage 54, for a second line. The third passage 53 has an opening on an upper surface of the second plural-line passage block 22 at a vicinity of an inlet end thereof and is in communication with an inlet port 17a of the outlet-side on-off valve 17 in the second line. The fourth passage 54 has one end in communication with the second passage 52 and the other end in communication with an outlet port 17b of the outlet-side on-off valve 17 in the second line.

The second plural-line passage block 22 includes a sixth passage 56 and a seventh passage 57, for a third line. The sixth passage 56 has an opening on an upper surface of the second plural-line passage block 22 at a vicinity of an inlet end thereof and is in communication with an inlet port 17a of the outlet-side on-off valve 17 in the third line. The seventh passage 57 has one end in communication with the fourth passage 54 and the other end in communication with an outlet port 17b of the outlet-side on-off valve 17 in the third line.

Figure 12:
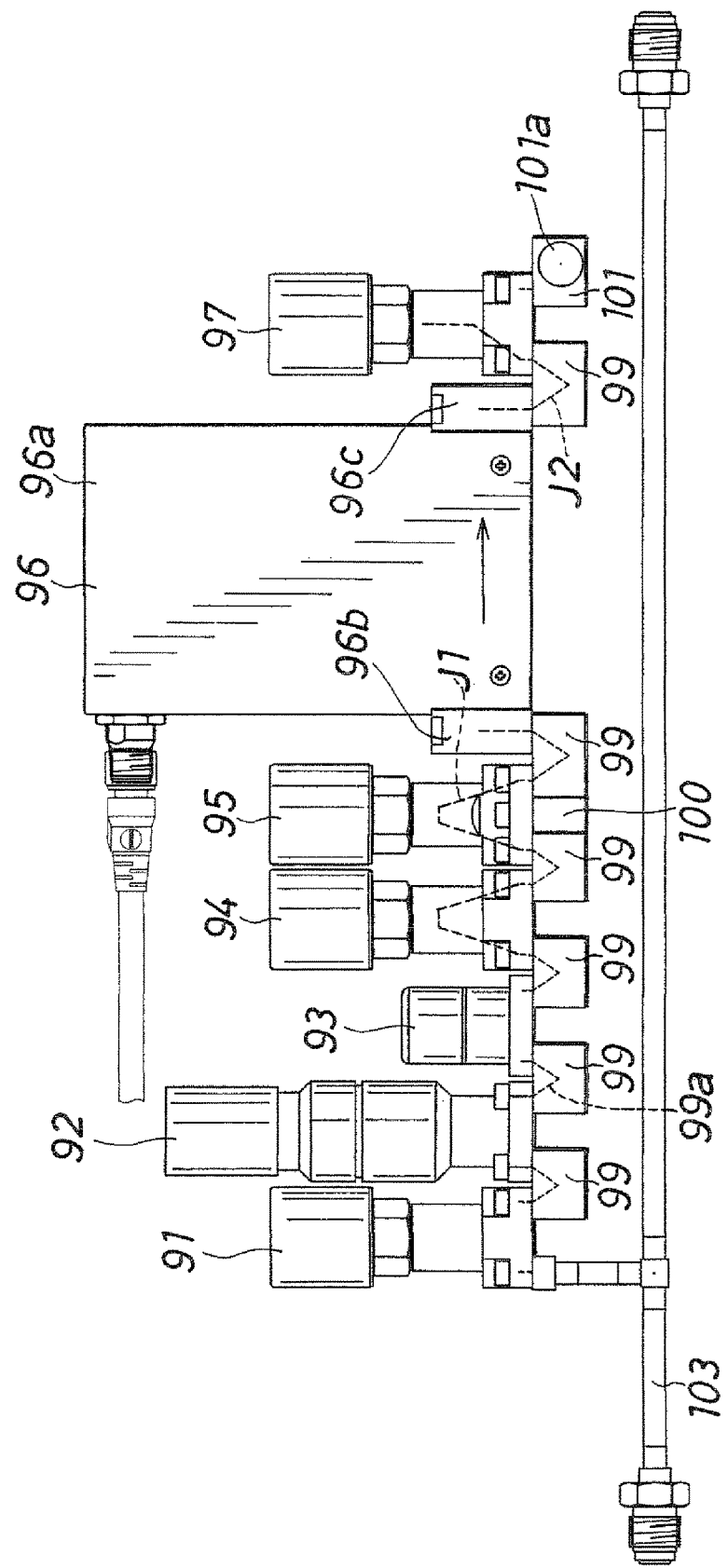
FIG. 12 is a side view showing a conventional fluid control apparatus.

Comparison between the embodiment in accordance with the present invention as shown in FIG. 1 and the conventional example as shown in FIG. 12 reveals that the number of components required in an area where the first plural-line passage block 21 covers greatly differs between the cases in FIGS. 1 and 12. Specifically stated, in the comparative example in FIG. 12, three block joints 99 each having a V-shaped passage are required for each line, which means nine block joints 99 are required for three lines. In addition, a manifold block joint 100 is needed, which results in ten block joints 99, 100 in total to be needed. In contrast, the embodiment according to the present invention as shown in FIG. 1 requires only one first plural-line passage block 21, whereby the number of components required for the area describe above are greatly reduced.

The first inlet-side on-off valve 14 and the second inlet-side on-off valve 15 are attached to the first plural-line passage block 21 as shown in FIG. 3, where the attachment can be accomplished without seals. Therefore, the embodiment in accordance with the present invention eliminates the need for the conventional seals disposed between the first and second inlet-side on-off valves 94, 95 and the block joints 99, 100.

Comparison between the embodiment in accordance with the present invention as shown in FIG. 1 and the conventional example as shown in FIG. 12 reveals that the number of components required in an area where the second plural-line passage block 22 covers greatly differs between the cases in FIGS. 1 and 12. Specifically stated, the comparative example in FIG. 12 requires three block joints 99 plus one manifold block joint 101 for the three lines. In contrast, the embodiment according to the present invention as shown in FIG. 1 requires only one second plural-line passage block 21, whereby the number of components required for the area describe above are greatly reduced.

Using the first plural-line passage block 21 and the second plural-line passage block 22 successfully reduce a volume within the passages. Specifically stated, FIG. 12 shows conventional passage volumes on the inlet and outlet sides, which are indicated in dashed bold lines J1 and J2, respectively. In contrast, FIG. 1 shows passage volumes on the inlet and outlet sides in accordance with the present embodiment, which are indicated in dashed bold lines A1 and A2, respectively. Comparison between FIGS. 1 and 12 reveals that the passage volumes on both sides in FIG. 1 decrease as compared to those in FIG. 12. The passage volume on the inlet and outlet sides is preferably greatly reduced in terms of improvement of the gas replaceability and reduction of the amount of gas impurities. Using the plural-line passage blocks 21, 22 enables the passage length to be minimized, which can reduce the passage volume by 10 to 20% as compared to the conventional case.

In the case where the fluid control apparatus has a plurality of lines, there may be a case in which predetermined number of lines cannot be formed by merely using the first plural-line passage block 21 and the second plural-line passage block 22, both are for three lines as discussed above. To cope with this problem, a first single-line passage block 25 and a second single-line passage block 26 are used. These blocks 25 and 26 has a shape with compatibility with the first plural-line passage block 21 and the second plural-line passage block 22, both used for three lines.

Figure 7:
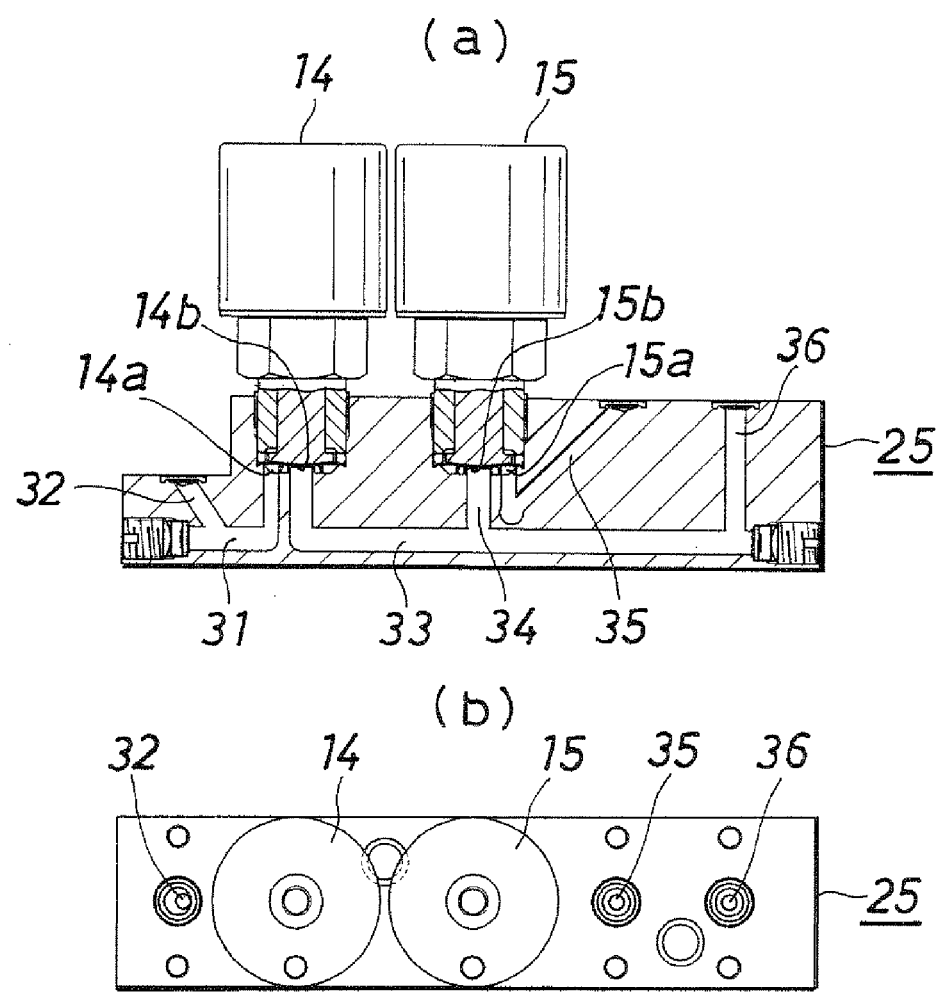
FIG. 7 shows an embodiment of a first single-line passage block used in the fluid control apparatus in accordance with the present invention, together with inlet-side on-off valves, in which FIG. 7(*a*) is a side view and FIG. 7(*b*) is a plan view.
Figure 8:
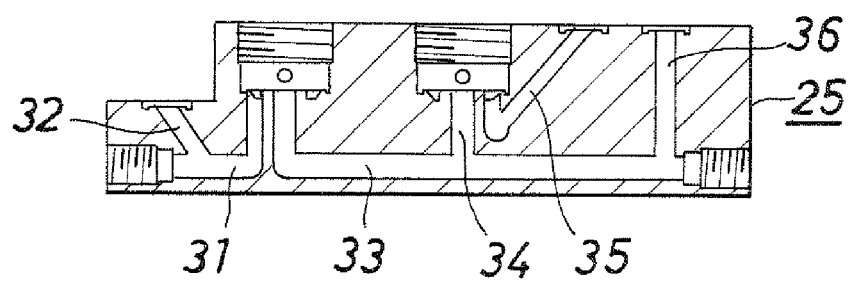
FIG. 8 shows the first single-line passage block of FIG. 7, with the inlet-side on-off valves detached, in which FIG. 8(*a*) is a side view and FIG. 8(*b*) is a plan view.
Figure 8:
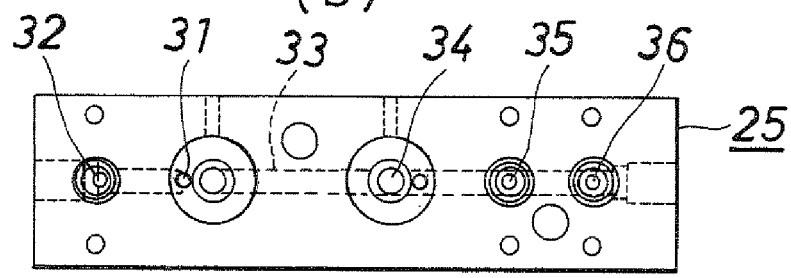

The first single-line passage block 25, as shown in FIGS. 7 and 8, has a first passage 31, a second passage 32, a third passage 33, a fourth passage 34, a fifth passage 35, and a sixth passage 36. The first passage 31 is in communication with an inlet port 14a of the first on-off valve 14 in the first line. The second passage 32 is bifurcated from the first passage 31 and has an opening on an upper surface of the first single-line passage block 25 in a vicinity of an inlet end thereof. The third passage 33 is in communication with an outlet port 14b of the first on-off valve 14 in the first line. The fourth passage 34 extends upward from a middle portion of the third passage 33 and is in communication with an outlet port 15b of the second on-off valve 15 in the first line. The fifth passage 35 has an upward opening and is in communication with an inlet port 15a of the second on-off valve 15 in the first line. The sixth passage 36 extends upward from a vicinity of an end of the third passage 33 and has an upward opening.

Figure 9:
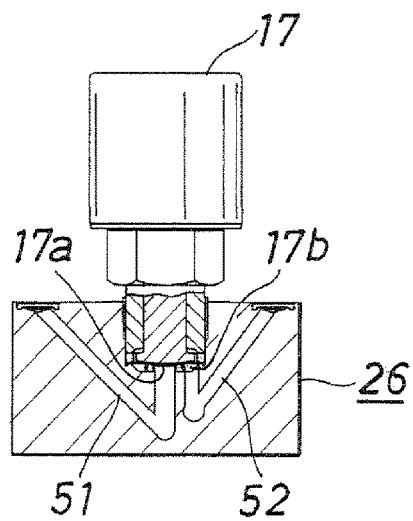
FIG. 9 shows an embodiment of a second single-line passage block used in the fluid control apparatus in accordance with the present invention, together with an outlet-side on-off valve, in which FIG. 9(*a*) is a side view and FIG. 9(*b*) is a plan view.
Figure 9:
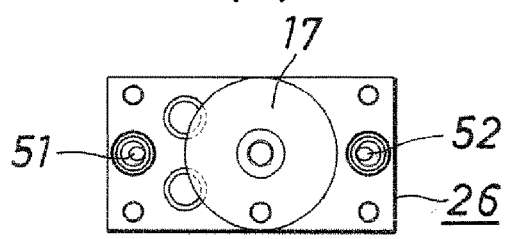
Figure 10:
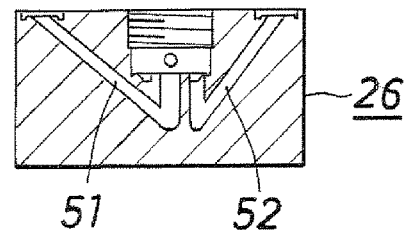
FIG. 10 shows the second single-line passage block of FIG. 9, with the outlet-side on-off valve detached, in which FIG. 10(*a*) is a side view and FIG. 10(*b*) is a plan view.
Figure 10:
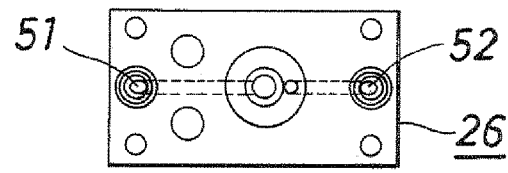

The second single-line passage block 26, as shown in FIGS. 9 and 10, has a first passage 51 and a second passage 52. The first passage 51 has an upward opening in a vicinity of an inlet-side end and is in communication with an inlet port 17a of the outlet-side on-off valve 17 in the first line. The second passage 52 has an upward opening in a vicinity of an inlet-side end and is in communication with an outlet port 17b of the outlet-side on-off valve 17 in the first line.

The first plural-line (three-line) passage block 21 and the second plural-line (three-line) passage block 22 may be used together with the first single-line passage block 25 corresponding to the passage block 21 and the second single-line passage block 26 corresponding to the passage block 22. Such a combined use of various blocks 21, 22, 25, 26 provide flexibility. For example, a total of sixteen lines may be formed by using five three-line passage blocks and one single-line passage block or by using four three-line passage blocks and four single-line passage blocks. The latter is suitable for the case where four corrosive lines are provided.

In the embodiment discussed above, the first plural-line passage block 21 and the second plural-line passage block 22 are both for three lines, but the plural-line passage block are not limited for use in three lines. They may be two-line passage blocks, four-line passage blocks, and five-line passage blocks, for example.

Figure 11:
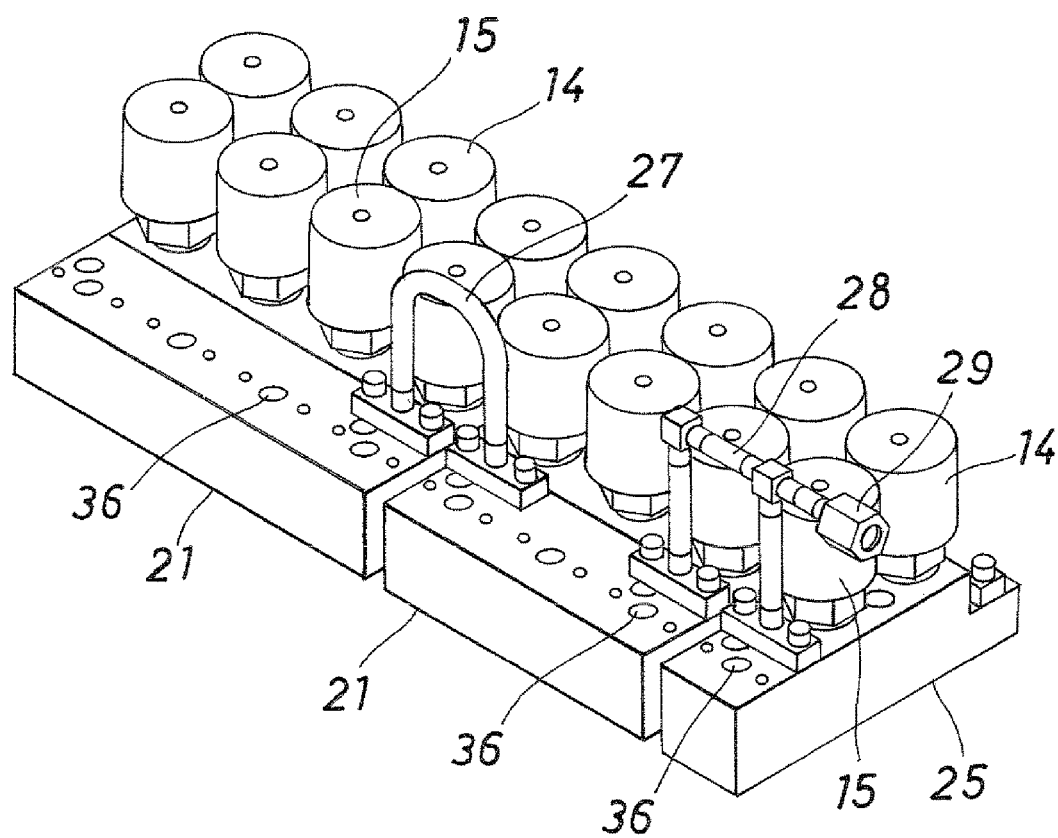
FIG. 11 is a perspective view showing an example of configuration of connecting the adjacent passage blocks arranged in parallel.

FIG. 11 shows examples of connecting the first plural-line passage blocks 21, and of connecting the first plural-line passage blocks 21 and the first single-line passage block 25, which are adjacent to one another. In FIG. 11, passages having openings on upper surfaces of the passage blocks 21, 25 arranged in adjacent lines are connected with each other by a first inverted U-shaped pipe 27 and a second inverted U-shaped pipe 28, respectively. The openings being connected are an opening of the fifth passage 35 of the first plural-line passage block 21 shown in FIGS. 3 and 4, and an opening of the fifth passage 35 of the first single-line passage block 25 shown in FIGS. 7 and 8. The second inverted U-shaped pipe 28 is connected to a pipe 29 that supplies a purge gas thereto. The inverted U-shaped pipes 27, 28 together with the fifth passage 35, the eleventh passage 41, and the seventeenth passage 47 in the plural-line passage block 21 enable a purge gas to be supplied to the entire lines.

Using the first inverted U-shaped pipe 27 and the second inverted U-shaped pipe 28 facilitates determination regarding how to use the plural-line passage block 21, 22 and the single-line passage block 25, 26 in combination, whereby the increase or decrease of the number of the lines may be readily accomplished.

INDUSTRIAL APPLICABILITY

The fluid control apparatus of the present invention includes a plurality of fluid control devices and a plurality of passage blocks, which reduces the number of components required and facilitates alteration such as increase or decrease of the number of lines. Hence, the present invention provides a fluid control apparatus suitable for use in, for example, semiconductor fabrication equipment.

The invention claimed is:

1. A fluid control apparatus comprising:
   an upper stage having a plurality of fluid control devices, two or more fluid control devices operatively coupled in series forming a line; and
   a lower stage having a plurality of passage blocks, the passage blocks operatively coupling two or more fluid control devices on the upper stage, the upper stage and the lower stage constitute a plurality of lines arranged in parallel,
   wherein at least one of the plurality of passage blocks are a first plural-line passage block, the first plural line passage block forming the lower stage for two or more adjacent lines,
   wherein the first plural-line passage block receives the upper stage of at least two lines of the plurality of lines and the first plural-line passage block supports at least two fluid control devices in each of the at least two lines, and
   the first plural-line passage block includes one or more longitudinal passages in communication with a respective control device passage of each of the fluid control devices within a line and two or more transverse passages therein, the two or more transverse passages transversely connecting a plurality of fluid control devices disposed in parallel in a plurality of lines;
   wherein the fluid control devices forming each line include a flow rate controller that regulates a flow rate, two inlet-side on-off valves, and an outlet-side on-off valve,
   the flow rate controller having a body, an inlet extension, and an outlet extension, and the fluid control apparatus further comprises,
   a second plural-line passage block,
   wherein the at least two of the two or more fluid control devices are supported by the first plural-line passage block, the at least two fluid control devices are the inlet extension of the flow rate controller and the two inlet-side on-off valves, the two inlet-side on-off valves being arranged in series with the inlet extension of the flow rate controller, and
   the at least two of the two or more fluid control devices are supported by the second plural-line passage block, the at least two fluid control devices are the outlet extension of the flow rate controller and the one outlet-side on-off valve, the one outlet-side on-off valve being arranged in series with the outlet extension of the flow rate controller.

2. The fluid control apparatus according to claim 1, further comprising:
   at least one of the plurality of passage blocks being a single-line passage block, the single line passage block forming the lower stage of a single line of the plurality of lines,
   wherein the single-line passage block receives the upper stage of one of the plurality of lines and supports the at least two fluid control devices communicating with those supported by the first plural-line passage block, and
   the first plural-line passage block and the at least one single-line passage block together forming a single line.

3. The fluid control apparatus according to claim 2,
   wherein the fluid control devices forming each line include a flow rate controller that regulates a flow rate, two inlet-side on-off valves, and an outlet-side on-off valve,
   the flow rate controller having a body, an inlet extension, and an outlet extension, and the fluid control apparatus further comprises,
   a second plural-line passage block,
   wherein the at least two fluid control devices are supported by the first plural-line passage block, the at least two fluid control devices being the inlet extension of the flow rate controller and the two inlet-side on-off valves, the two inlet-side on-off valves being arranged in series with the inlet extension of the flow rate controller, and
   the at least two fluid control devices are supported by the second plural-line passage block, the at least two fluid control devices being the outlet extension of the flow rate controller and the one outlet-side on-off valve, the one outlet-side on-off valve being arranged in series with the outlet extension of the flow rate controller.

4. The fluid control apparatus according to claim 1, wherein the first plural-line passage block has a first opening on an upper surface of the first plural-line passage block in a first line, and a second opening on an upper surface of the first plural-line passage block in an adjacent line, and the first opening and the second opening are connected to each other by an inverted U-shaped pipe forming a passage within the first plural line passage block.

5. The fluid control apparatus according to claim 1, each plural-line passage block has a first opening on an upper surface of the plural-line passage block in a first line, and a second opening on an upper surface of the plural-line passage block in an adjacent line, and the first opening and the second opening are connected to each other by an inverted U-shaped pipe forming a passage within the first plural line passage block.

6. A fluid control apparatus comprising:
   an upper stage having a plurality of fluid control devices, two or more fluid control devices operatively coupled in series forming a line; and
   a lower stage having a plurality of passage blocks, the passage blocks operatively coupling two or more fluid control devices on the upper stage, each respective line having a flow controller having a body, an inlet extension, and an outlet extension, as one of the fluid control devices on the upper stage, wherein the upper stage and the lower stage form a plurality of lines arranged in parallel,
   wherein at least one of the plurality of passage blocks being a first plural-line passage block, the first plural line passage block forming the lower stage for two or more lines,
   wherein the first plural-line passage block receives the upper stage of at least two lines of the plurality of lines and the first plural-line passage block supports at least two fluid control devices in each of the at least two lines, and
   the first plural-line passage block includes one or more longitudinal passages in communication with a respective fluid control device passage of each of the fluid control devices within a line and two or more transverse passages therein, the two or more transverse passages transversely connecting a plurality of fluid control devices in parallel in the plurality of lines; and
   wherein the longitudinal passages communicate with at least one of the inlet extension and outlet extension of the flow rate controller and at least one on-off valve;

wherein the fluid control devices forming each line include a flow rate controller that regulates a flow rate, two inlet-side on-off valves, and an outlet-side on-off valve, the flow rate controller having a body, an inlet extension, and an outlet extension, and the fluid control apparatus further comprises, a second plural-line passage block, wherein the at least two fluid control devices being supported by the first plural-line passage block are the inlet extension of the flow rate controller and the two inlet-side on-off valves, the two inlet-side on-off valves being arranged in series with the inlet extension of the flow rate controller, and the at least two fluid control devices being supported by the second plural-line passage block are the outlet extension of the flow rate controller and the one outlet-side on-off valve, the one outlet-side on-off valve being arranged in series with the outlet extension of the flow rate controller.

7. The fluid control apparatus according to claim 6, further comprising:

at least one of the plurality of passage blocks being a single-line passage block, the single-line passage block forming the lower stage of a single line of the plurality of lines, wherein the single-line passage block receives the upper stage of one of the plurality of lines and supports the at least two fluid control devices of the plurality of fluid control devices also supported by the first plural-line passage block, and the first plural-line passage block and the-single-line passage block together forming a single line.

* * * * *